(12) United States Patent
Yu et al.

(10) Patent No.: US 11,990,517 B2
(45) Date of Patent: May 21, 2024

(54) ELECTRONIC DEVICE AND METHOD OF MANUFACTURING THE SAME

(71) Applicant: RESEARCH & BUSINESS FOUNDATION SUNGKYUNKWAN UNIVERSITY, Suwon-si (KR)

(72) Inventors: Woojong Yu, Suwon-si (KR); Thanh Luan Phan, Suwon-si (KR); Hyungjin Kim, Seoul (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 102 days.

(21) Appl. No.: 17/699,783

(22) Filed: Mar. 21, 2022

(65) Prior Publication Data

US 2022/0310792 A1    Sep. 29, 2022

(30) Foreign Application Priority Data

Mar. 25, 2021  (KR) .................. 10-2021-0038497

(51) Int. Cl.
   *H01L 29/12*   (2006.01)
   *B82B 1/00*    (2006.01)
   *B82B 3/00*    (2006.01)
   *B82Y 10/00*   (2011.01)

(52) U.S. Cl.
   CPC ............ *H01L 29/122* (2013.01); *B82B 1/006* (2013.01); *B82B 3/0028* (2013.01); *B82Y 10/00* (2013.01)

(58) Field of Classification Search
   CPC ...... H10K 10/50; H10K 10/701; H10N 70/20; H10N 70/881; H10N 70/257; H01L 29/0673; H01L 29/0669; H01L 29/0665; H01L 29/068
   See application file for complete search history.

(56) References Cited

U.S. PATENT DOCUMENTS

| | | | | |
|---|---|---|---|---|
| 6,400,489 B1* | 6/2002 | Suzuki | ...................... | G02F 1/21 |
| | | | | 252/582 |
| 6,891,744 B2* | 5/2005 | Chen | ..................... | G11C 13/025 |
| | | | | 438/758 |
| 7,642,541 B2* | 1/2010 | Matsui | ................... | H10K 10/84 |
| | | | | 257/E51.023 |
| 2018/0337300 A1* | 11/2018 | Lee | ........................ | H10K 85/60 |
| 2018/0342579 A1* | 11/2018 | Zhang | ................. | H10K 85/221 |

FOREIGN PATENT DOCUMENTS

| | | | | |
|---|---|---|---|---|
| KR | 889779 B1 * | 3/2009 | ............. | B82Y 10/00 |
| KR | 2013022972 A * | 3/2013 | ......... | H01L 51/0032 |
| KR | 2017083730 A * | 7/2017 | ............. | H01L 45/04 |

* cited by examiner

*Primary Examiner* — Raj R Gupta
(74) *Attorney, Agent, or Firm* — NSIP Law

(57) ABSTRACT

An electronic device is disclosed. The electronic device includes: a first electrode disposed on a substrate and extending in a first direction; a second electrode disposed above the first electrode and extending in a second direction intersecting the first direction; and at least one switching particle disposed between the first electrode and the second electrode and bonded to the first electrode and the second electrode via van der Waals bond, wherein the switching particle controls flow of current between the first electrode and the second electrode, based on a difference of voltages of the first electrode and the second electrode applied thereto.

10 Claims, 5 Drawing Sheets

ELECTRONIC DEVICE AND METHOD OF MANUFACTURING THE SAME

CROSS REFERENCE TO RELATED APPLICATIONS

This application claims the benefit under 35 U.S.C. 119(a) of Korean Patent Application No. 10-2021-0038497 filed on Mar. 25, 2021 in the Korean Intellectual Property Office, the entire disclosure of which is incorporated herein by reference for all purposes.

TECHNICAL FIELD

The present disclosure relates to an electronic device having a size of a sub-nanometer scale and capable of controlling flow of current, and a manufacturing method thereof.

BACKGROUND ART OF THE INVENTION

There is a trend toward miniaturization of an electronic device to enable a highly integrated circuit.

In line with this trend, a lot of research on a sub-nanometer-scale electronic device having a structure in which a material that controls flow of current is sandwiched between two electrodes is being conducted. This electronic device may be applied to fields such as a diode, an optical sensor, and a memory.

In order to apply this sub-nanometer scale electronic device to the fields, the device should be able to perform a stable current control operation using a nanometer scale material, as well as be structurally stable, and minimize defects in a manufacturing process.

DESCRIPTION

Challenge to Solve

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose of the present disclosure is to provide an electronic device capable of controlling flow of current using a switching particle.

Another purpose of the present disclosure is to provide a method for manufacturing the electronic device.

Another purpose of the present disclosure is to provide an electronic device capable of controlling flow of current using a switching molecule.

Solution to the Problem

Purposes in accordance with the present disclosure are not limited to the above-mentioned purpose. Other purposes and advantages in accordance with the present disclosure as not mentioned above may be understood from following descriptions and more clearly understood from embodiments in accordance with the present disclosure. Further, it will be readily appreciated that the purposes and advantages in accordance with the present disclosure may be realized by features and combinations thereof as disclosed in the claims.

A first aspect of the present disclosure provides an electronic device comprising: a first electrode disposed on a substrate and extending in a first direction; a second electrode disposed above the first electrode and extending in a second direction intersecting the first direction; and at least one switching particle disposed between the first electrode and the second electrode and bonded to the first electrode and the second electrode via van der Waals bond, wherein the switching particle controls flow of current between the first electrode and the second electrode, based on a difference of voltages of the first electrode and the second electrode applied thereto.

In one implementation of the first aspect, each of the first electrode and the second electrode is independently made of carbon nanotubes or metal nanowires.

In one implementation of the first aspect, the switching particle includes a metal core particle having electrical conductivity and an insulating film covering a surface of the metal core particle.

In one implementation of the first aspect, the metal core particle is made of one metal selected from a group consisting of gold (Au), silver (Ag), nickel (Ni), copper (Cu) and aluminum (Al), wherein the insulating film is made of metal oxide, metal nitride, or organic material having electrically insulating ability.

In one implementation of the first aspect, the insulating film is made of an oxide of the metal constituting the metal core particle.

In one implementation of the first aspect, the metal core particle has a diameter in a range of 0 nm to 1000 nm, wherein the insulating film has a thickness in a range of 1 nm to 100 nm.

In one implementation of the first aspect, the switching particle includes a quantum dot.

A second aspect of the present disclosure provides a method for manufacturing an electronic device, the method comprising: forming a linear first electrode on a surface of a substrate so as to extend in a first direction; forming at least one switching particle on the first electrode; and forming a second electrode on the at least one switching particle so as to extend in a second direction intersecting the first direction.

In one implementation of the second aspect, the forming of the at least one switching particle includes: forming a metal core particle on the first electrode using an electrochemical deposition process; and oxidizing a surface of the metal core particle.

In one implementation of the second aspect, the at least switching particle includes switching particles, wherein the forming of the at least one switching particle includes applying a solution in which quantum dots are dispersed on the first electrode and then drying the solution.

In one implementation of the second aspect, each of the first electrode and the second electrode is independently formed using a dry transfer process.

A third aspect of the present disclosure provides an electronic device comprising: a first electrode disposed on a substrate and extending in a first direction; a second electrode disposed above the first electrode and extending in a second direction intersecting the first direction; and at least one switching molecule disposed between the first electrode and the second electrode and bonded to the first electrode and the second electrode via van der Waals bond, wherein a three-dimensional structure of the switching molecule is reversibly converted to between a cis-isomer and a trans-isomer so as to control flow of current between the first electrode and the second electrode.

In one implementation of the third aspect, the switching molecule includes azobenzene.

In one implementation of the third aspect, the three-dimensional structure of the switching molecule is reversibly converted to between the cis-isomer and the trans-isomer, based on a voltage applied across both opposing ends of the molecule or a wavelength of light applied to the molecule.

Effects of the Invention

According to the electronic device and the manufacturing method thereof in accordance with the present disclosure, electronic devices may be stacked in a vertical structure to form the electronic device at high density. Since the switching particles or switching molecules are bonded to the first and second electrodes via van der Waals bonding, the electronic device having high-performance and high-stability may be manufactured at high yield without a high-temperature heat treatment process.

According to the electronic device and the manufacturing method thereof in accordance with the present disclosure, the electronic devices may be stacked in a vertical structure to form an electronic device at high density. Further, the current flow between the first electrode and the second electrode may be controlled by changing the three-dimensional structure of the switching molecules. Since the switching molecules are bonded to the first and second electrodes via van der Waals bond, a high-performance and high-stability electronic device may be manufactured at high yield without a high-temperature heat treatment process.

In addition to the effects as described above, specific effects in accordance with the present disclosure will be described together with following detailed descriptions for carrying out the disclosure.

DETAILED DESCRIPTION FOR INVENTION'S IMPLEMENT

Figure 1:
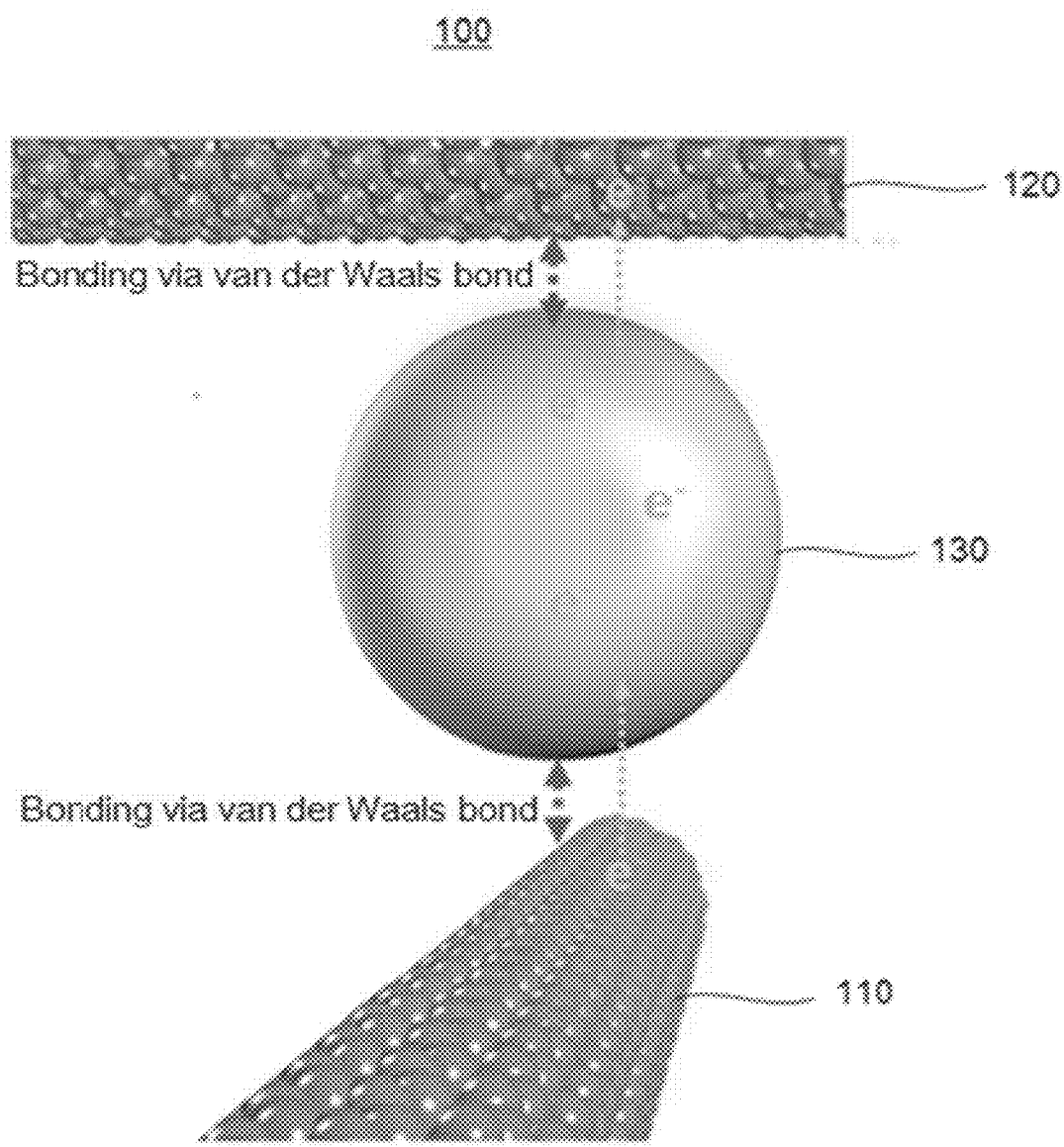
FIG. 1 is a diagram for illustrating an electronic device according to an embodiment of the present disclosure.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram for illustrating an electronic device according to an embodiment of the present disclosure.

Referring to FIG. 1, an electronic device 100 according to an embodiment of the present disclosure may include a first electrode 110, a second electrode 120, and a switching particle 130. The electronic device 100 may control flow of current via the switching particle 130, and may be applied to a memory device, an optical sensor device, a diode device, and the like.

The first electrode 110 and the second electrode 120 may be spaced apart from each other so that they at least partially overlap each other. Each of the first electrode 110 and the second electrode 120 may be independently made of a material having electrical conductivity.

In an embodiment, the first electrode 110 may extend in a first direction, and the second electrode 120 may be positioned above the first electrode 110 on a substrate (not shown), and may extend in a second direction intersecting the first direction. In this case, the switching particle 130 may be disposed at an intersection of the first electrode 110 and the second electrode 120, and may be bonded to the first electrode 110 and the second electrode 120 via van der Waals bond and thus may be fixedly disposed therebetween.

In an embodiment, each of the first electrode 110 and the second electrode 120 may be independently made of carbon nanotubes, metal nanowires, or the like.

The switching particle 130 may be disposed between the first electrode 110 and the second electrode 120, and may be electrically connected thereto, and may perform a switching operation to allow (ON) or disallow (OFF) flow of current. For example, the switching particle 130 may allow the flow of current when a voltage difference between voltages of the first electrode 110 and the second electrode 120 is equal to or greater than a threshold voltage. To the contrary, the switching particle 130 may disallow the flow of current when the voltage difference between voltages of the first electrode 110 and the second electrode 120 is smaller than the threshold voltage.

In an embodiment, the switching particle 130 may include a metal core particle having electrical conductivity and an insulating film covering a surface of the metal core particle. In this case, when a voltage equal to or greater than the threshold voltage is applied between the first electrode 110 and the second electrode 120, electrons may pass through the insulating layer via tunneling, etc., thereby allowing the flow of current. In addition, when a voltage smaller than the threshold voltage is applied between the first electrode 110 and the second electrode 120, the insulating layer may block the movement of electrons, thereby disallowing the flow of current.

In one embodiment, the metal core particle may be made of a metal having electrical conductivity, such as gold (Au), silver (Ag), nickel (Ni), copper (Cu), aluminum (Al). The insulating layer may be made of a metal oxide, a metal nitride, an organic material, etc. having electrical insulating properties. For example, the metal core particle may be made of one metal selected from nickel (Ni), copper (Cu), aluminum (Al), and the like, and the insulating layer may be made of an oxide of the metal. In this case, the insulating film may be formed by oxidizing a surface of the metal core particle using a method such as heat treatment.

In an embodiment, the metal core particle may have a diameter in a range of about 10 nm to 1000 nm, and the insulating layer may have a thickness in a range of about 1 nm to 100 nm.

In another embodiment, the switching particles 130 may include a quantum dot particle. The quantum dot is a semiconductor crystal. When the voltage greater than or equal to the threshold voltage is applied between the first electrode 110 and the second electrode 120, the quantum dot may allow the flow of current. To the contrary, when the voltage smaller than the threshold voltage is applied between the first electrode 110 and the second electrode 120, the quantum dot may disallow the flow of current.

Figure 2:
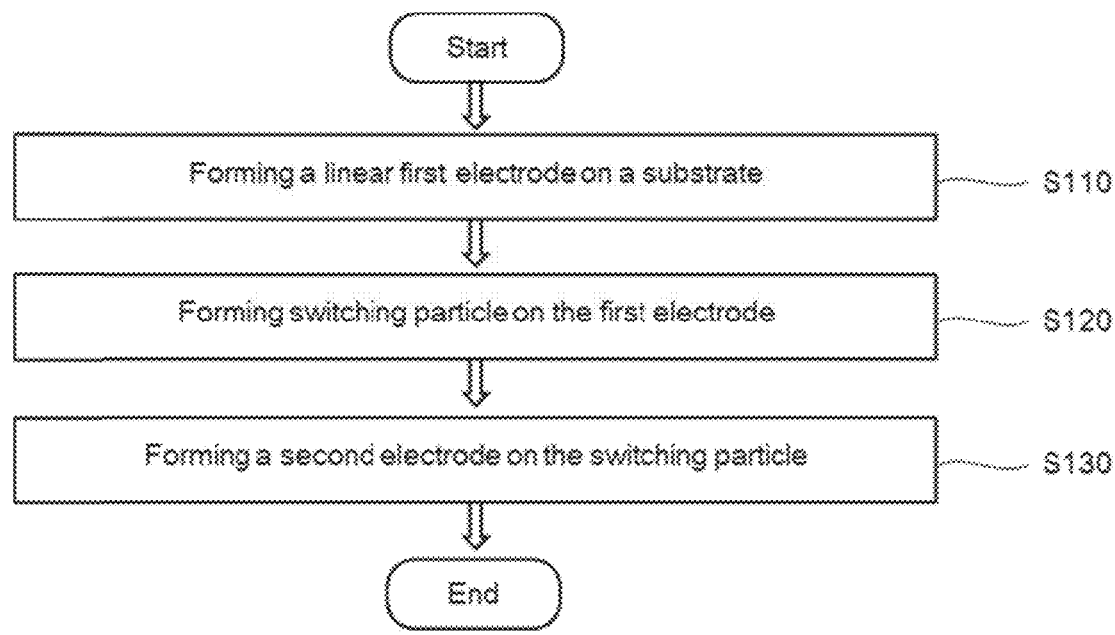
FIG. 2 is a diagram for illustrating a method of manufacturing the electronic device shown in FIG. 1.

FIG. 2 is a diagram for illustrating a method of manufacturing the electronic device shown in FIG. 1.

Referring to FIG. 2 together with FIG. 1, a method of manufacturing an electronic device according to an embodiment of the present disclosure includes a first step S110 of forming a linear first electrode 110 extending in a first direction on a substrate; a second step S120 of forming a switching particle 130 on the first electrode 110; a third step S130 of forming a second electrode 120 extending in a second direction intersecting the first direction on the switching particle 130.

In the first step S110, the first electrode 110 may be made of carbon nanotubes or metal nanowires, and may be directly synthesized on the substrate or may be disposed on the substrate using a dry transfer method.

In an embodiment, a plurality of first electrodes 110 may be formed on the substrate so as to be spaced apart from each other by a regular spacing. Ends of the first electrodes 110 may be fixed to a conductive pad (not shown) and may be electrically connected to each other. In one embodiment, the material of the conductive pad is not particularly limited. For example, the conductive pad may be made of a conductive metal such as gold (Au), silver (Ag), copper (Cu), or nickel (Ni).

In one embodiment, when the first electrodes 110 are made of carbon nanotubes, the first electrodes 110 may be formed as follows. A catalyst solution having a precursor concentration of 0.005 to 0.03 M is first applied to an edge of a support using mCP (micro contact printing technique). Then, Ar/$H_2$ mixed gas flows thereto at 900 to 1000° C. for 20 minutes to 1 hour, and then Ar gas is injected into ethanol serving as a carbon source to induce bubbling. Thus, the carbon nanotubes having a specific length may be synthesized. The carbon nanotubes may be transferred to the substrate using dry transfer at room temperature. Thus, the first electrodes 110 may be formed.

In the second step S120, a plurality of switching particles 130 spaced apart from each other may be formed on the first electrode 110.

In an embodiment, the switching particles 130 may be directly formed on the first electrode 110 via an electrochemical deposition process. Alternatively, the switching particles 130 may be formed on the first electrode 110 by applying a solution in which the synthesized switching particles 130 are dispersed to the first electrode.

In an embodiment, when the switching particles 130 have a core-shell structure of a metal core particle and an insulating film covering a surface of the metal core particle, the switching particles 130 may be formed as follows. The first electrode 110 together with a metal source material are immersed in electrolyte. In this state, a positive voltage is applied to the metal source material and a ground or negative voltage is applied to the first electrode 110, such that metal ions supplied from the metal source material are electrochemically deposited on the first electrode 110, thereby producing metal core particles. The core particle is subjected to heat treatment such that a surface thereof is oxidized, thereby forming the insulating film. In this way, the switching particles 130 having the core-shell structure may be formed on the first electrode 110.

In the third step S130, the second electrode 120 may be made of carbon nanotubes or metal nanowires, and may be disposed on the switching particle 130 using a dry transfer method.

In one embodiment, when the first electrodes 110 extending in the first direction are formed to be spaced apart from each other by a regular spacing and are disposed on the substrate, the second electrodes 120 may extend in the second direction intersecting the first direction, for example, perpendicular to the first direction, and may be formed to be spaced apart by a regular spacing. The switching particles 130 may be respectively disposed at intersections between the first electrodes 110 and the second electrodes 120. At each intersection, each of the switching particles 130 may be bonded to the first electrode 110 and the second electrode 120 via van der Waals bond.

In one embodiment, the carbon nanotubes or metal nanowires are arranged on a sacrificial layer made of a water-soluble material so as to be spaced from each other by a regular spacing. Then, a PMMA layer is formed thereon, and then the carbon nanotubes or metal nanowires are transferred onto the PMMA layer by dissolving the sacrificial layer in water. Thereafter, the PMMA layer is disposed on the switching particles 130 and then is removed such that the carbon nanotubes or metal nanowires are transferred onto the switching particles 130.

According to the electronic device and the manufacturing method thereof in accordance with the present disclosure, electronic devices may be stacked in a vertical structure to form the electronic device at high density. Since the switching particles or switching molecules are bonded to the first and second electrodes via van der Waals bonding, the electronic device having high-performance and high-stability may be manufactured at high yield without a high-temperature heat treatment process.

Figure 3:
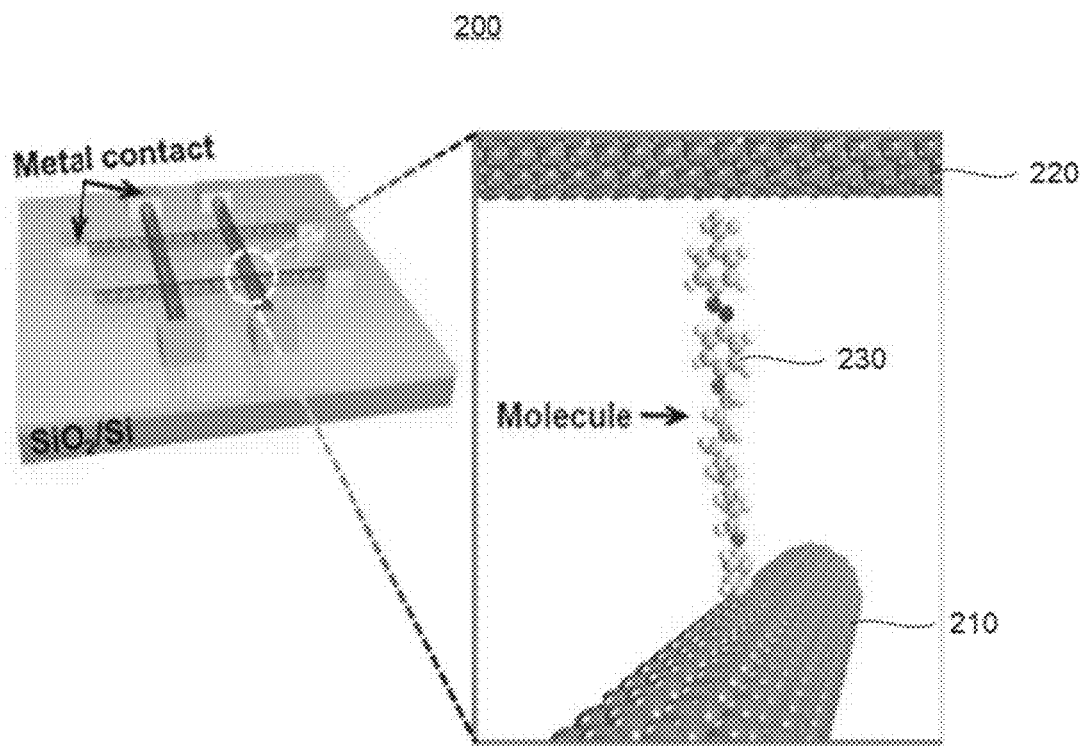
FIG. 3 is a diagram for illustrating an electronic device according to another embodiment of the present disclosure.

FIG. 3 is a diagram for illustrating an electronic device according to another embodiment of the present disclosure.

Referring to FIG. 3, an electronic device 200 according to another embodiment of the present disclosure may include a first electrode 210, a second electrode 220, and a switching molecule 230. The electronic device 200 may control the flow of current via the switching molecule 230, and may be applied to a memory device, an optical sensor device, a diode device, and the like.

Since the first electrode 210 and the second electrode 220 are substantially the same as the first electrode 110 and the second electrode 120 of the electronic device 100 as described with reference to FIG. 1, respectively, duplicate detailed description thereof the will be omitted.

The switching molecule 230 may include a single molecule or a polymer, and may have isomerism in which the molecule converts into isomers having different electrical resistances. The switching molecules 230 may be arranged, in a self-assembly manner, in a direction from the first electrode 210 toward the second electrode 220, and may be bonded to the first and second electrodes 210 and 220 via Der Waals bond.

In an embodiment, the switching molecule 230 may include an azobenzene molecule. A three-dimensional structure of the azobenzene molecule may be configured such that the molecule may be reversibly converted between a cis-isomer and a trans-isomer. In one embodiment, when the azobenzene molecule has a three-dimensional structure of a trans-isomer, internal dipoles of the molecule are oriented along an electric field direction to increase an amount by which an external electric field is cancelled. As a result, when a potential difference is applied across both opposing ends of the molecule, the cancelled amount may increase due to a polarized internal dipole moment of the molecule, so that a smaller amount of current flows. In another embodiment, when the azobenzene molecule has a three-dimensional structure of the cis isomer, the orientations of the internal dipoles of the molecule are changed, such that the amount by which the external electric field is cancelled becomes smaller. Thus, when the same potential difference is applied across both opposing ends of the molecule, a much larger amount of current may flow. Therefore, the azobenzene molecule may control the current flow via change in the three-dimensional structure.

In one example, the three-dimensional structure of the switching molecule 230 may be converted based on a voltage difference applied across both opposing ends of the molecule or using light of a specific wavelength.

According to the electronic device of this embodiment, the electronic devices may be stacked in a vertical structure to form an electronic device at high density. Further, the current flow between the first electrode and the second electrode may be controlled by changing the three-dimensional structure of the switching molecules. Since the switching molecules are bonded to the first and second electrodes via van der Waals bond, a high-performance and high-stability electronic device may be manufactured at high yield without a high-temperature heat treatment process.

Hereinafter, Examples of the present disclosure will be described in detail. However, the following examples are only some embodiments of the present disclosure, and the scope of the present disclosure is not limited to the following examples.

Present Example 1

The switching particles were formed on a lower electrode made of a single-walled carbon nanotube. In this regard, the switching particle has a nickel core having a diameter of about 100 nm and an insulating film formed by oxidizing a surface of the nickel core at 200° C. for 1 hour. Then, an upper electrode made of a single-walled carbon nanotube was formed thereon. Thus, an electronic device was manufactured.

Comparative Example 1

An electronic device was manufactured in the same manner as that in Present Example 1, except that heat treatment was performed at 100° C. for 30 minutes after forming the nickel core.

Experimental Example 1

Figure 4:
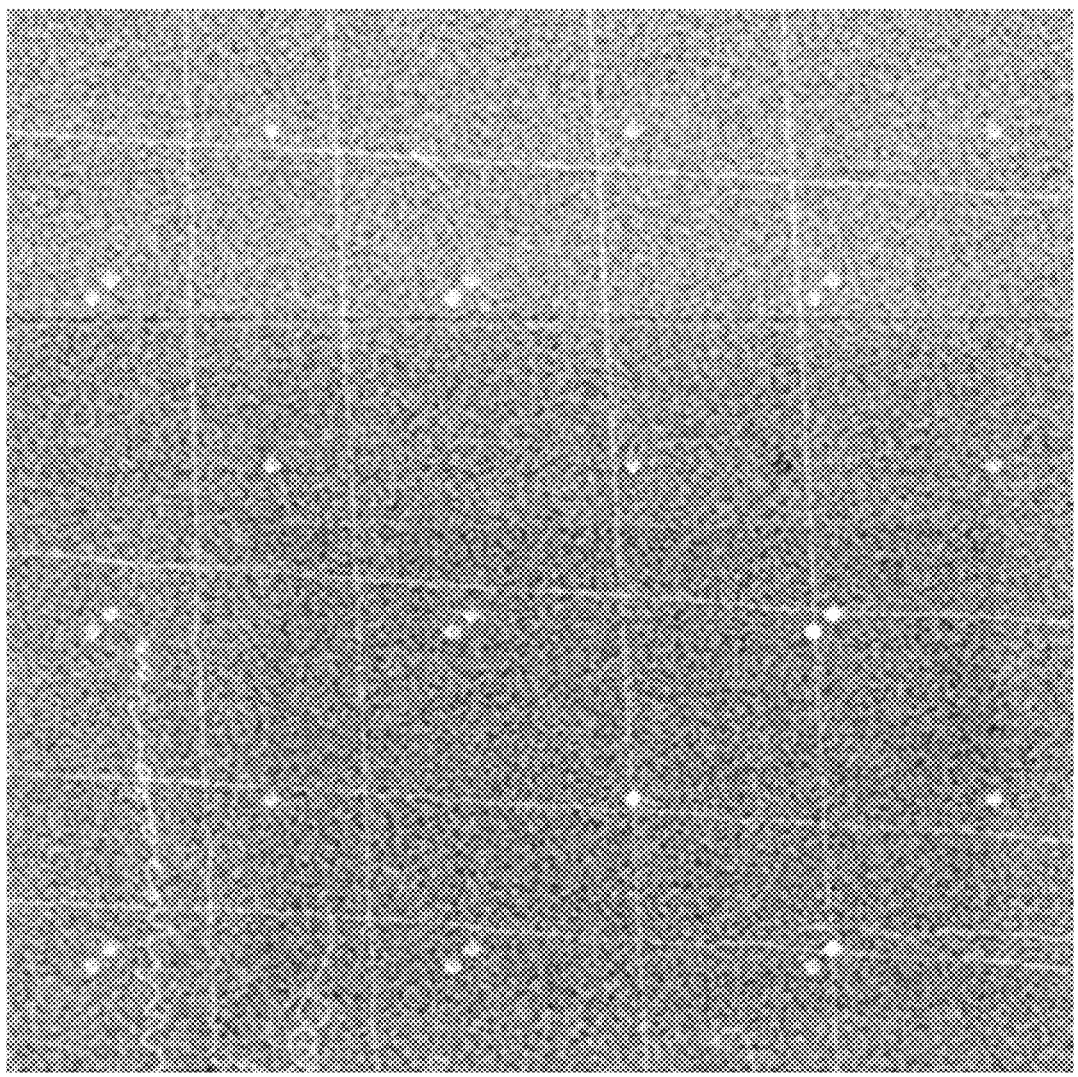
FIG. 4 is an SEM image of an electronic device manufactured according to Present Example 1.

FIG. 4 is an SEM image of an electronic device manufactured according to Present Example 1.

It was identified that in the electronic device shown in FIG. 4, more than 90% of aligned devices had stable current control characteristics.

Figure 5A:
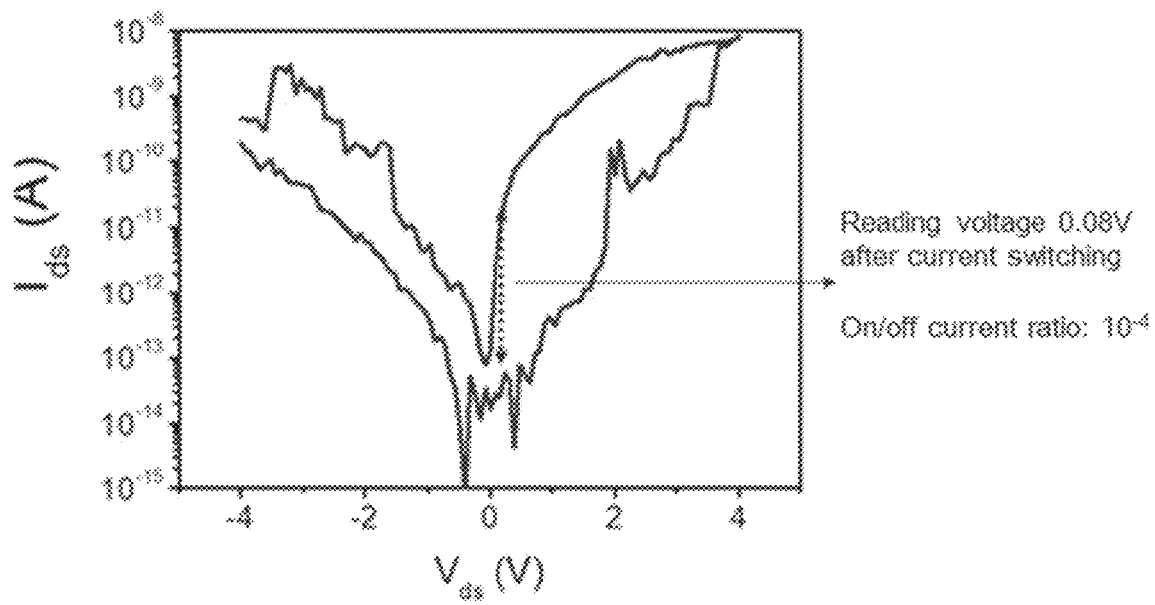
FIG. 5A shows a I-V curve of the electronic device of Present Example 1.
Figure 5B:
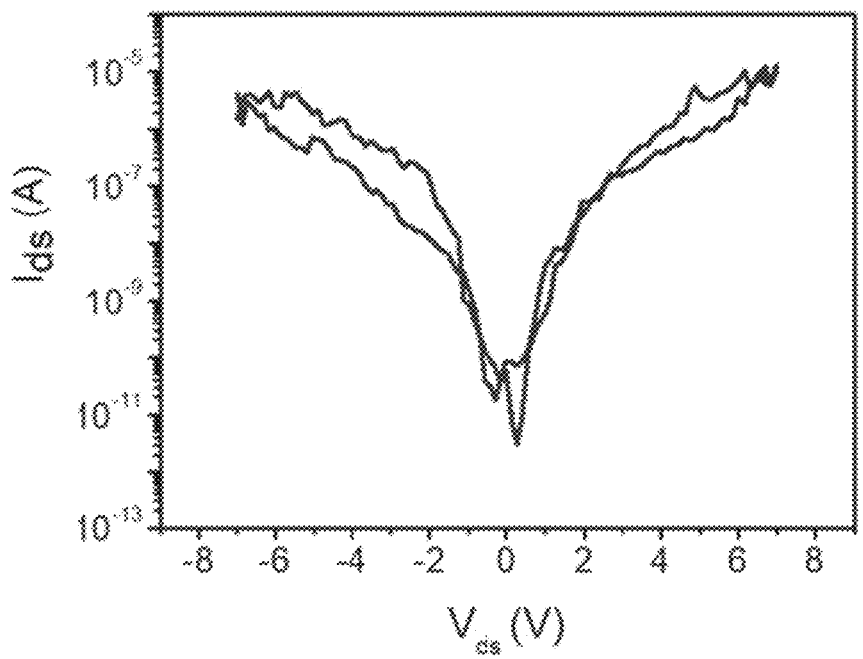
FIG. 5B shows a I-V curve of an electronic device of Comparative Example 1.

FIG. 5A shows a I-V curve of the electronic device of Present Example 1, and FIG. 5B shows a I-V curve of the electronic device of Comparative Example 1.

Referring to FIG. 5A and FIG. 5B, it may be identified that memory ability varies based on an oxide coating amount. When the nickel nanoparticle which plays a role of current control is oxidized at 200° C. for 1 hour, a sufficient oxide (insulation) coating amount was formed on the nanoparticle while the lower electrode is protected. Thus, the electrode was protected and an energy bandgap of the nanoparticle was sufficient. Therefore, it may be identified that a range of an on/off ratio according to the voltage application extends (FIG. 5A).

However, when the heat treatment was performed at 100° C. for 30 minutes, the insulation coating was not sufficiently formed, so that the energy band gap was not sufficient, and as a result, the on/off ratio hardly appeared (FIG. 5B).

Example 2

An electronic device was fabricated by forming the azobenzene molecules so that the molecules were arranged, in a self-assembly manner, between the upper and lower electrodes made of single-walled carbon nanotubes and both opposing ends thereof were bonded to the upper and lower electrodes, respectively.

Experimental Example 2

The electronic device of Present Example 2 was manufactured via multi-bond points bonding in which one-dimensional carbon nanotubes were aligned with each other. Thus, it was identified that 93.78% of the devices exhibited a stable on/off current ratio of $10^2$ or greater. Further, it was identified that non-volatile memory characteristic lasted for larger than $10^3$ seconds and multiple Program/Erase cycles were implemented.

Figure 6:
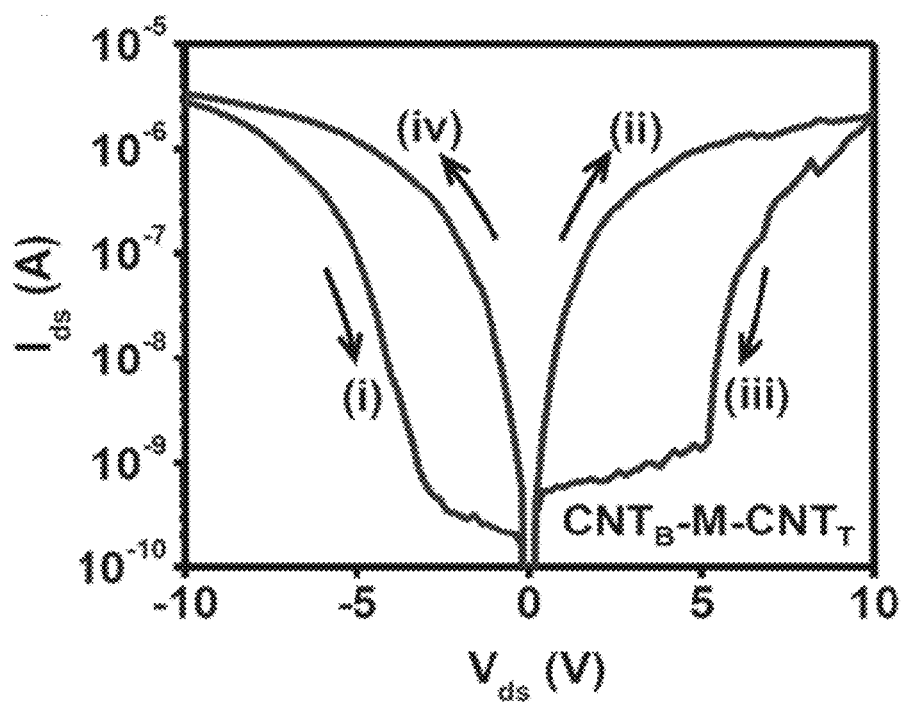
FIG. 6 shows a I-V curve of an electronic device of Present Example 2.

FIG. 6 shows a I-V curve of the electronic device of Present Example 2.

Referring to FIG. 6, it may be identified when the azobenzene molecule is formed as a current control material between two carbon nanotube electrodes (in this case, the molecules are arranged in a vertical direction in a self-assembly manner), the orientation of the dipoles of the azobenzene molecule changes via application of external energy (voltage or light), such that the current flowing between the two electrodes is stably controlled. This may be identified based on the current-voltage characteristics of FIG. 6.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. the scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

| [Description of symbols] | |
| --- | --- |
| 100, 200: an electronic device | 110, 210: a first electrode |
| 120, 220: a second electrode | 130, 230: a switching particle |

The invention claimed is:

1. An electronic device comprising:
a first electrode disposed on a substrate and extending in a first direction;
a second electrode disposed above the first electrode and extending in a second direction intersecting the first direction; and
at least one switching particle disposed between the first electrode and the second electrode and bonded to the first electrode and the second electrode via van der Waals bond,
wherein the switching particle controls flow of current between the first electrode and the second electrode, based on a difference of voltages of the first electrode and the second electrode applied thereto.

2. The electronic device of claim 1, wherein each of the first electrode and the second electrode is independently made of carbon nanotubes or metal nanowires.

3. The electronic device of claim 1, wherein the switching particle includes a metal core particle having electrical conductivity and an insulating film covering a surface of the metal core particle.

4. The electronic device of claim 3, wherein the metal core particle is made of one metal selected from a group consisting of gold (Au), silver (Ag), nickel (Ni), copper (Cu) and aluminum (Al),
wherein the insulating film is made of metal oxide, metal nitride, or organic material having electrically insulating ability.

5. The electronic device of claim 4, wherein the insulating film is made of an oxide of the metal constituting the metal core particle.

6. The electronic device of claim 3, wherein the metal core particle has a diameter in a range of 10 nm to 1000 nm, wherein the insulating film has a thickness in a range of 1 nm to 100 nm.

7. The electronic device of claim 1, wherein the switching particle includes a quantum dot.

8. An electronic device comprising:
a first electrode disposed on a substrate and extending in a first direction;
a second electrode disposed above the first electrode and extending in a second direction intersecting the first direction; and
at least one switching molecule disposed between the first electrode and the second electrode and bonded to the first electrode and the second electrode via van der Waals bond,
wherein a three-dimensional structure of the switching molecule is reversibly converted to between a cis-isomer and a trans-isomer so as to control flow of current between the first electrode and the second electrode.

9. The electronic device of claim 8, wherein the switching molecule includes azobenzene.

10. The electronic device of claim 9, wherein the three-dimensional structure of the switching molecule is reversibly converted to between the cis-isomer and the trans-isomer, based on a voltage applied across both opposing ends of the molecule or a wavelength of light applied to the molecule.

* * * * *